United States Patent
Beppu

(10) Patent No.: US 6,800,556 B2
(45) Date of Patent: Oct. 5, 2004

(54) POLISHING METHOD USING CERIA SLURRY, AND METHOD OF MANUFACTURING SEMICONDUCTOR DEVICE

(75) Inventor: Toshiyasu Beppu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 133 days.

(21) Appl. No.: 10/156,014

(22) Filed: May 29, 2002

(65) Prior Publication Data

US 2002/0187637 A1 Dec. 12, 2002

(30) Foreign Application Priority Data

May 30, 2001 (JP) .......................................... 2001-163102

(51) Int. Cl.$^7$ .............................................. H01L 21/302

(52) U.S. Cl. ........................ 438/691; 438/692; 438/693; 451/36

(58) Field of Search ................................. 438/691, 692, 438/693; 451/36, 41, 50

(56) References Cited

U.S. PATENT DOCUMENTS 6,217,412 B1 * 4/2001 Campbell et al. ............... 451/8
6,435,942 B1 * 8/2002 Jin et al. ......................... 451/8
6,595,831 B1 * 7/2003 Hirokawa et al. ............. 451/36

FOREIGN PATENT DOCUMENTS

| JP | 8-294861 | 11/1996 |
| JP | 10-152673 | 6/1998 |
| JP | 2000-216120 | 8/2000 |

* cited by examiner

Primary Examiner—Lan Vinh
(74) Attorney, Agent, or Firm—McDermott Will & Emery LLP

(57) ABSTRACT

Polishing processes are separated into a plurality of phases; that is, an early polishing phase, a planarization phase, and a post-planarization phase. Polishing is effected by means of changing polishing requirements from phase to phase. Since polishing is effected under appropriate polishing requirements which vary from phase to phase, a polishing time is shortened by means of increasing a polishing rate in each phase. By means of polishing a wafer through use of highly-selective ceria slurry having superior smoothness, high smoothness and high productivity can be achieved simultaneously.

7 Claims, 5 Drawing Sheets

POLISHING METHOD USING CERIA SLURRY, AND METHOD OF MANUFACTURING SEMICONDUCTOR DEVICE

BACKGROUND OF THE INVENTION

1. Field of the Invention

The present invention relates to a polishing method using a ceria slurry, and more particularly, to a polishing method which is preferable in a planarization process employing chemical-and-mechanical polishing (CMP), such as a semiconductor device process or an interconnection-integrated liquid-crystal process.

2. Description of the Related Art

A technique for planarizing the surface of a semiconductor substrate during manufacturing processes is one means for responding to an increase in packing density of and miniaturization of a semiconductor device. By way of an example of a polishing apparatus employed by a related-art CMP technique, a polishing apparatus described in Japanese Patent Application Laid-Open No. 294861/1996 will now be described by reference to FIG. 1 and FIG. 2.

Here, FIG. 1 is a perspective view showing a polishing apparatus, and FIG. 2 is a top view of the apparatus. A polishing cloth 115 for polishing a surface to be polished is affixed to a turntable 113 which rotates within a horizontal plane. A wafer-holding disk 114 is placed in an elevated position over the turntable 113 for holding a wafer 116 such that a surface of a semiconductor substrate, which surface is to be polished (hereinafter called a "target surface"), is placed opposite the surface of the polishing cloth 115. The rotation center C of the wafer-holding disk 114 is offset from the rotation center D of the turntable 113 by a given distance E.

A grinding fluid supply pipe 117 for supplying a grinding fluid to a polishing surface 115a of the polishing cloth 115 and a dressing fluid supply pipe 120 for supplying dressing fluid to the polishing surface 115a are situated at elevated positions over the turntable 113. Further situated over the turntable 113 is a fluid discharge mechanism 123 for discharging grinding waste fluid produced and dressing fluid after polishing operation.

The diameter of the wafer-holding disk 114 is shorter than the radius of the turntable 113. The turntable 113 rotates in the direction designated by arrow A, and the wafer-holding disk 114 rotates in the direction designated by arrow B. A circle F designated by two-dot chain lines shown in FIG. 2 shows a locus which is drawn in the vicinity of the rotation center of the polishing cloth 115 by the outer edge of the wafer 116 held by the wafer-holding disk 114.

Grinding fluid is supplied from the grinding fluid supply pipe 117 to the polishing surface 115a of the polishing cloth 115 affixed to the turntable 113, which plate is rotating at a given speed. Simultaneously, water serving as dressing fluid is supplied from the dressing fluid supply pipe 120 to the polishing surface 115a.

The wafer-holding disk 114 having the wafer 116 fixed thereon is lowered while being rotated at a certain speed. As a result, a target surface of the wafer 116 is pressed against the polishing surface 115a, thereby polishing the target surface. The fluid discharge mechanism 123 collects the grinding waste fluid and dressing fluid produced after polishing operation. In the manner as mentioned above, the wafer 116 is polished.

Silica-based slurry ($SiO_2$-based slurry) has frequently been used as a polishing agent for polishing an oxide film. Silica-based slurry is characterized by uniform particle size and being unlikely to cause scratches. However, silica-based slurry has a low polishing rate. Hence, in a case where a large amount of grinding is required, silica-based slurry poses a problem. For this reason, ceria slurry ($CeO_2$-based slurry) yielding a high polishing rate has recently come to attention and has come to be employed frequently.

Even when polishing fluid of either type is used, abrasion of recesses proceeds when pattern steps are subjected to planarization. Hence, difficult is encountered in reducing steps to a certain height or less. Further, there arises another problem of a large amount of abrasion being required until steps are reduced to the certain height. Ceria slurry with additives (hereinafter called "highly selective ceria slurry") has been developed for solving the foregoing problems.

So long as the highly selective ceria slurry is employed, a rate at which recesses are to be polished is suppressed, and the smoothness of the wafer can be improved greatly as compared with the case of use of related-art slurry. FIG. 3 shows an example result of polishing operation using highly selective ceria slurry. Polishing requirements are optimized in connection with the evenness of a film remaining within a wafer surface after polishing operation as well as in connection with a range in which abrasion of recesses does not proceed, the range characterizing the highly selective ceria slurry.

In FIG. 3, the horizontal axis represents polishing time, and the vertical axis represents the thickness of a residual film. A graph having plot points "x" shows the polishing status of recesses, and a graph having plot points "+" shows the polishing status of protuberances. As shown in FIG. 3, primarily protuberances are polished until 480 seconds have passed after the start of abrasion, and planarization is completed when the thickness of remaining recesses becomes substantially equal to that of remaining protuberances. After planarization has been completed, recesses and protuberances are polished until the residual film attains to a predetermined thickness.

It has been ascertained that ceria slurry usually has a low polishing rate until 120 seconds have passed after the start of abrasion; polishing rate is particularly low within a range of 60 seconds after the start of abrasion (not shown in FIG. 3). Therefore, as can be seen from FIG. 3, the following drawbacks are encountered even when the highly selective ceria slurry is employed.

(1) In an early stage of polishing operation, there is a range in which a polishing rate is considerably slow.

(2) A polishing rate attained while planarization is under way is lower than that attained in a case where related-art ceria slurry is employed.

(3) A considerably low polishing rate is attained after planarization has been completed, and planarization of a remaining film to a predetermined thickness involves consumption of much time.

As mentioned above, highly-selective ceria slurry possesses high smoothness but yields low productivity.

A conceivable method of solving the above-described problem is a polishing process using a plurality of types of slurry. However, such a method involves an increase in the number of ancillary facilities (such as a slurry supply unit or the like), as well as a necessity of a cleaning step at the time of switching of slurry for preventing coexistence of a plurality of types of slurry. Hence, achieving an improvement in total productivity is difficult.

SUMMARY OF THE INVENTION

The present invention has been conceived to solve the foregoing drawbacks and is aimed at providing a polishing method which enables simultaneous realization of good smoothness and productivity through use of ceria slurry. There is also provided a method of manufacturing a semiconductor device using such a polishing method.

According to one aspect of the present invention, in a polishing method using ceria slurry, in which ceria slurry is supplied to a polishing surface in rotation, and a surface of a semiconductor substrate opposing the polishing surface is pressed against the polishing surface, thereby polishing the surface to be polished, the polishing processing is divided into a plurality of phases, and polishing is effected while polishing requirements are changed from phase to phase.

According to other aspect of the present invention, in a polishing method using ceria slurry, in which ceria slurry is supplied to a polishing surface in rotation, and a surface of a semiconductor substrate opposing the polishing surface is pressed against the polishing surface, thereby polishing the surface to be polished, the polishing process is divided into a plurality of phases, that is, an early polishing phase, a planarization phase, and a post-planarization phase, and polishing is effected while polishing requirements are changed from phase to phase.

According to other aspect of the present invention, in a polishing method using ceria slurry, in which ceria slurry is supplied to a polishing surface in rotation, and a surface of a semiconductor substrate opposing the polishing surface is pressed against the polishing surface, thereby polishing the surface to be polished, in an early polishing phase, polishing is effected by application of pressure greater than a predetermined pressure for pressing the surface to be polished against the polishing surface.

According to other aspect of the present invention, in a polishing method using ceria slurry, in which ceria slurry is supplied to a polishing surface in rotation, and a surface of a semiconductor substrate opposing the polishing surface is pressed against the polishing surface, thereby polishing the surface to be polished, in the planarization process, polishing is effected while the polishing surface and the surface to be polished are rotated at a speed higher than a predetermined speed.

According to other aspect of the present invention, in a polishing method using ceria slurry, in which ceria slurry is supplied to a polishing surface in rotation, and a surface of a semiconductor substrate opposing the polishing surface is pressed against the polishing surface, thereby polishing the surface to be polished, in the post-planarization phase, polishing is effected by means of applying pressure greater than a predetermined pressure for pressing the surface to be polished against the polishing surface.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENT

An embodiment of the present invention will be described hereinbelow by reference to the accompanying drawings.

Figure 4:
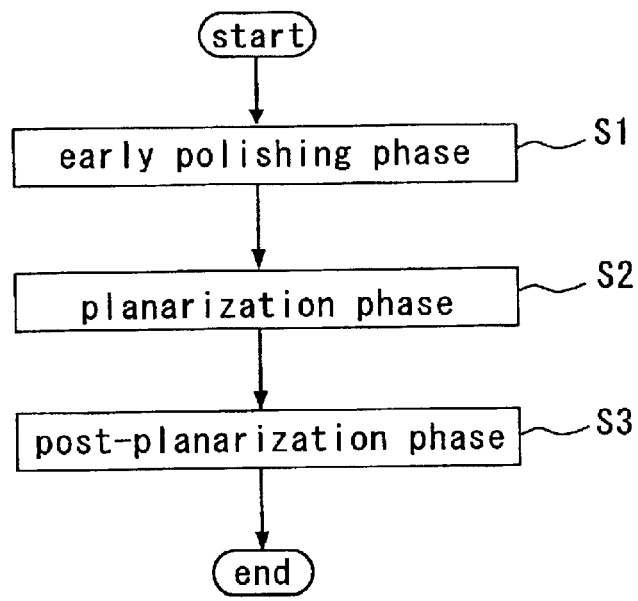
FIG. 4 is a flowchart showing a polishing process according to the present invention.

FIG. 4 is a flowchart showing a polishing process to which the present embodiment is applied. As shown in FIG. 4, in the present embodiment, a round of polishing processes is separated into a plurality of phases; namely, an early polishing phase (step S1), a planarization process (step S2), and a post-planarization process (step S3). Polishing is performed while polishing requirements are changed for the respective phases.

Polishing requirements for an early polishing phase will first be described. Measurement of the edge profile of pattern steps using a step gauge has shown that a considerably low polishing rate usually achieved in this phase is ascribable to the influence of the edge profile. The polishing rate increases as a result of the edge being rounded. Hence, in the present embodiment, high pressure polishing is effected as means for rounding the edge at an early stage. Pressure applied for polishing is greater than 30 KPa employed in conventional polishing operation; preferably, 50 to 70 KPa.

Figure 5:
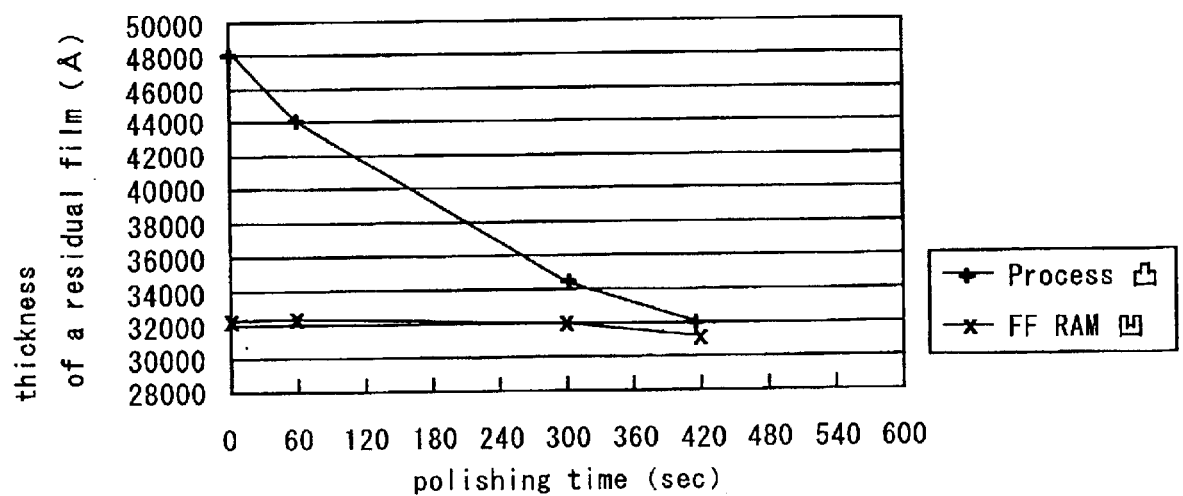
FIG. 5 is a plot showing variations in steps when polishing is effected at a polishing pressure of 50 KPa for 60 seconds.

FIG. 5 is a plot showing variations in steps when polishing is effected through use of highly-selective ceria slurry at a polishing pressure of 50 KPa for 60 seconds. In FIG. 5, the horizontal axis represents polishing time, and the vertical axis represents the thickness of a residual film. A graph having plot points "x" represents a polishing status of recesses, and a graph having plot points "+" represents a polishing status of protuberances. Planarization is completed about 60 seconds earlier than in the related-art planarization shown in FIG. 3. A period of planarization can be shortened by about 60 to 120 seconds by means of setting a polishing pressure to 50 KPa or more.

When high-pressure polishing using highly-selective ceria slurry is applied for polishing a wafer having steps, polishing rate varies greatly due to a difference in pressure, thereby deteriorating uniformity. However, this phase does not affect the final uniformity of a wafer. Hence, the high-pressure polishing method can be introduced. However, abrasion in this phase must be stopped before abrasion of recesses of steps is commenced. Polishing using related-art ceria slurry can also be introduced in this phase.

There will next be described a method of improving a polishing rate during a planarization process. When a wafer having a step-free surface formed thereon is subjected to abrasion, a polishing rate does not depend much on the rotation speed of a wafer and that of a turntable, as illustrated in Table 1.

TABLE 1

FAST-TURN POLISHING RATE

|  | ROTATION SPEED OF TOP RING | |
|---|---|---|
|  | 49 | 100 |
| ROTATION SPEED OF TURNTABLE  50 | 280.4 | 285.2 |
| 100 | 341.6 | 383.6 |

UNIT: (angstroms/min.)
POLISHING PRESSURE: 30 KPa

Figure 6:
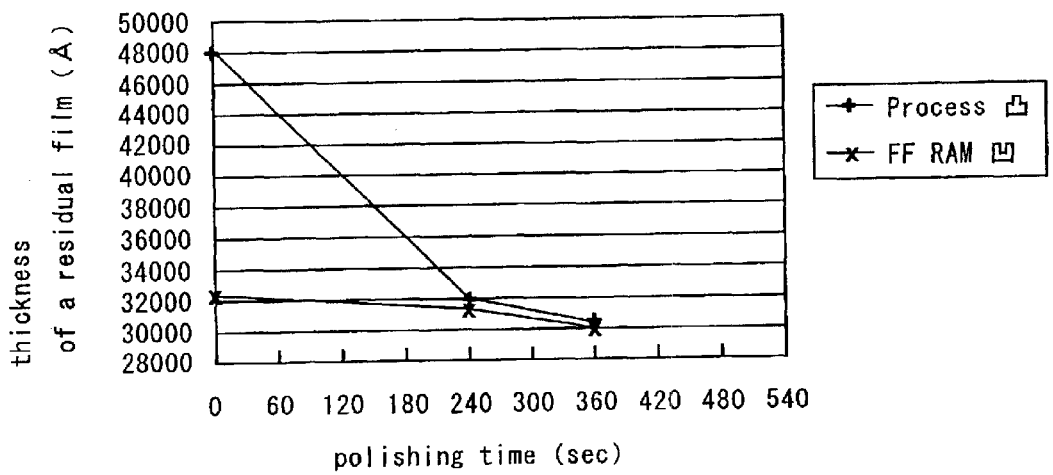
FIG. 6 is a plot showing changes in a step when the wafer is polished at a rotation speed of 100 rpm.

When steps are formed in the surface of a wafer, the polishing rate can be increased by means of increasing the rotation speed of a wafer and that of the turntable. In the present embodiment, the wafer was polished by means of increasing the number of revolutions of the wafer and that of the turntable by about 25 to 30 rpm over those employed in the related-art method. FIG. 6 is a plot showing changes in a step when the wafer is polished at a rotation speed of 100 rpm. A graph having plot points "x" represents the polishing status of recesses, and a graph having plot points "+" represents the polishing status of protuberances.

In a case where the wafer is polished by means of high-speed rotation, a mean polishing rate of 400 nm/min. is obtained from the beginning of polishing operation until the end of planarization (for 240 seconds). Under normal requirements, a mean polishing rate of 300 nm/min. is obtained until the end of planarization operation (for 240 to 480 seconds shown in FIG. 3). Hence, the mean polishing rate according to the present invention is considerably high. In consideration that a polishing rate under high-speed rotation requirements is a mean rate from the beginning of polishing operation, the polishing rate is increased remarkably over that achieved under related-art requirements.

Under high-speed rotation requirements, a polishing pressure is preferably set to a value of 35 KPa or less within a range in which no decrease arises in planarization efficiency F [defined by the following equation (1)].

$$F=(A-B+C)/(A-B)*100 \quad (1)$$

here A: an initial step, B: the amount of abrasion of protuberances, and C: the amount of abrasion of recesses.

The rotation speed must fall within a range in which there can be prevented occurrence of a drop in polishing rate and occurrence of chipping of edge of steps, which would otherwise be caused when centrifugal force resulting from an excessive increase in rotational speed of the turntable prevents introduction of slurry onto a wafer surface. Preferably, the rotation speed is as high as possible within the range. In general, a preferable range of rotation speed is 70 to 120 rpm.

Figure 7:
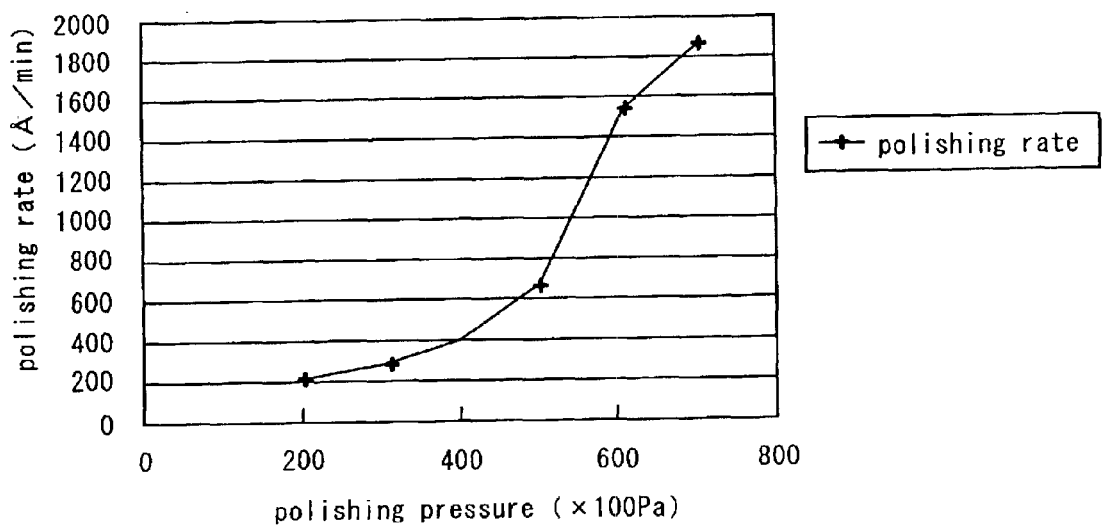
FIG. 7 shows a relationship between polishing pressure and polishing rate.

After completion of planarization, no substantial steps arise in a wafer surface. Hence, the requirements under which a wafer having a step-free oxide film formed thereon is polished can be applied. Even in the case of highly-selective ceria slurry, a polishing rate increases with polishing pressure. FIG. 7 shows a relationship between polishing pressure and polishing rate. As shown in FIG. 7, the polishing rate can be increased to 30 to 150 nm/min. by means of increasing the polishing pressure to 30 to 60 KPa.

As mentioned above, high-pressure polishing can be introduced after planarization. As a result, the time required for reducing the thickness of a residual film under the normal requirements can be shortened by about eighty percent. In steps subsequent to completion of planarization, the wafer may be polished through use of ordinary ceria slurry. Even in a case where either ordinary ceria slurry or ceria slurry according to the present invention is used, there is a necessity of achieving good uniformity during polishing operation.

Figure 8:
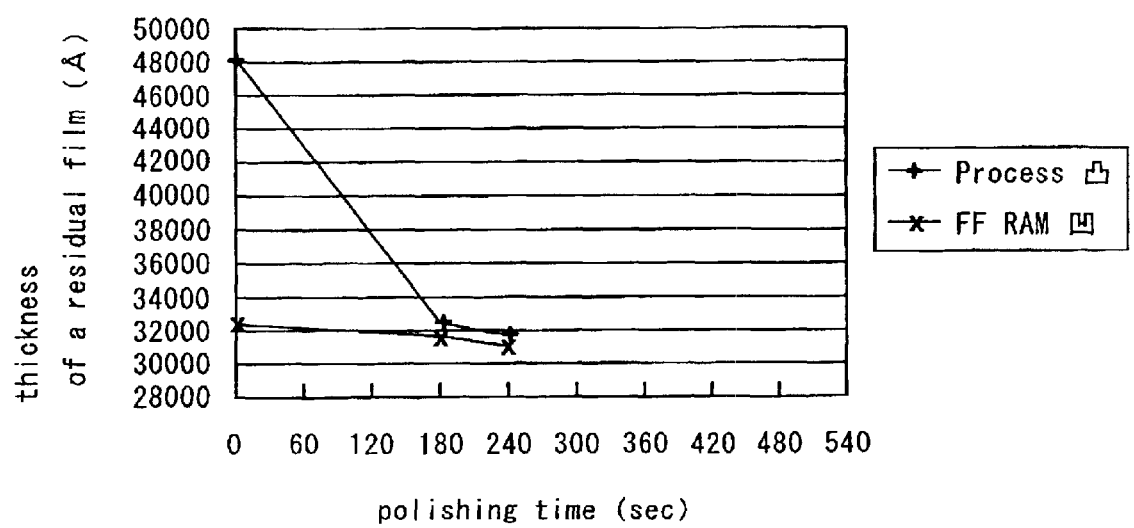
FIG. 8 is a plot showing the result of composite polishing operation.

The polishing requirements according to the present embodiment required in each of the steps; namely, the early polishing phase, the planarization phase, and the post-planarization phase, may be employed solely or in combination as required. FIG. 8 is a plot showing the result of composite polishing operation, wherein the polishing requirements according to the present embodiment have been applied to the early polishing phase and the planarization phase (abrasion of the wafer for reducing the thickness of a residual film without performance of planarization).

Figure 1:
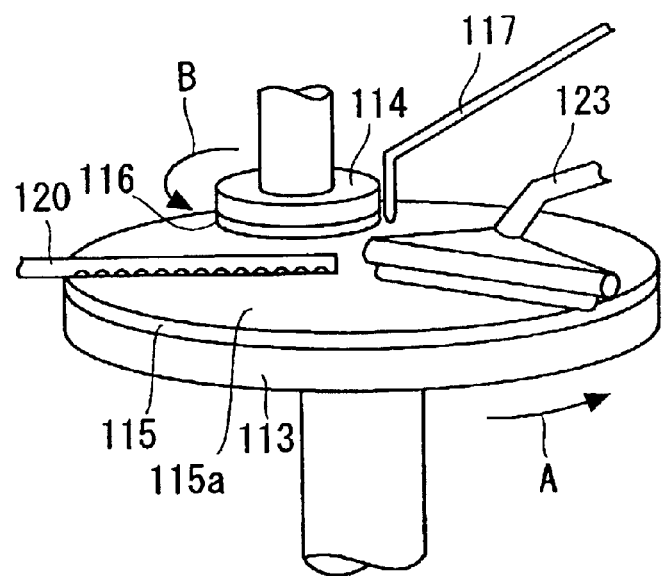
FIG. 1 is a perspective view showing a polishing apparatus.
Figure 2:
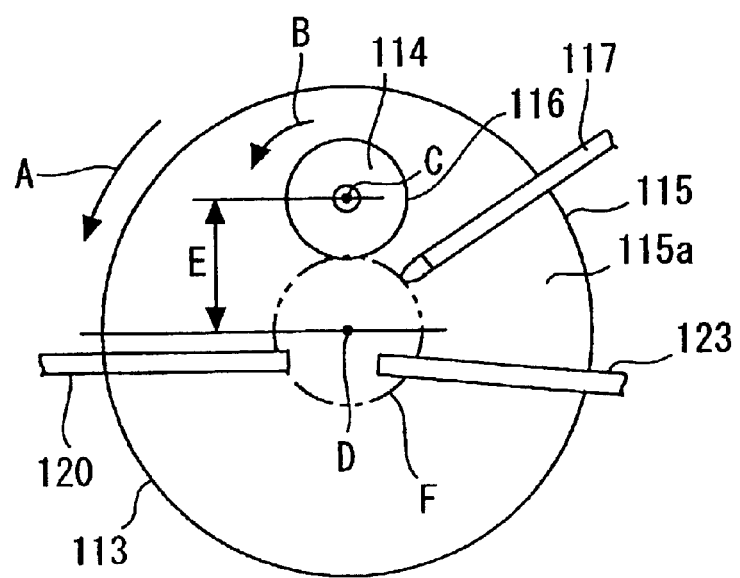
FIG. 2 is a top view of the polishing apparatus.
Figure 3:
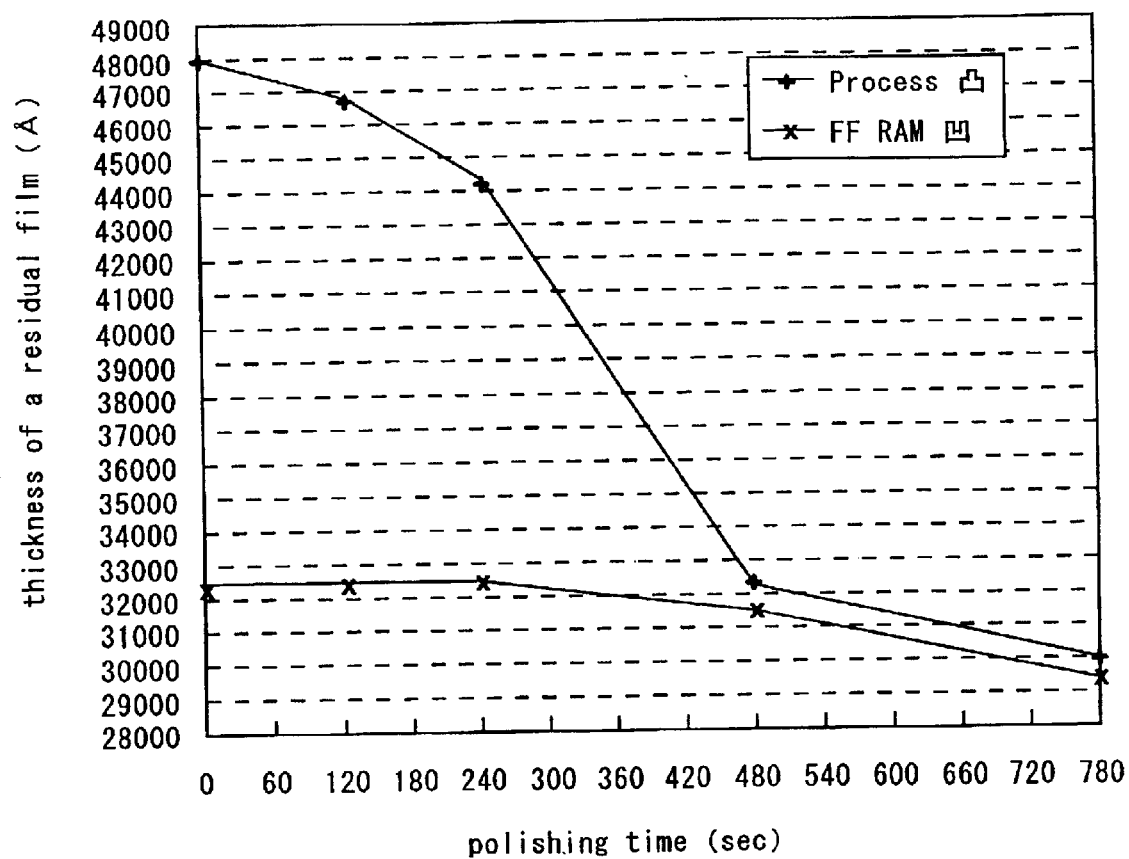
FIG. 3 shows an example result of polishing operation using highly selective ceria slurry.

As can be seen from a comparison between the graphs shown in FIG. 8 and those shown in FIG. 3, the polishing time can be shortened by about 240 to 300 seconds as compared with a polishing time required when a wafer is polished under the related-art standard requirements through use of highly-selective ceria slurry. Further, steps still remaining after polishing operation are the same as those formed under the related-art standard requirements. Hence, high smoothness and high productivity can be achieved simultaneously.

When composite polishing is performed, ordinary ceria slurry is employed in the early polishing phase and the post-planarization phase, as mentioned previously. Highly-selective ceria slurry may be employed in only the planarization process. In this case, switching of slurry is required. Even when consideration is given to the time for switching slurry, the productivity of wafer can be improved as compared with the related-art method.

The foregoing embodiment is summed up as follows. The polishing process is divided into a plurality of phases, that is, the early polishing phase, the planarization phase, and the post-planarization phase, and polishing is effected while polishing requirements are changed from phase to phase. In the early polishing phase, polishing may be effected by application of pressure greater than a predetermined pressure for pressing the surface to be polished against the polishing surface. The predetermined pressure may be 30 Kpa. In the planarization process, polishing may be effected while the polishing surface and the surface to be polished are rotated at a speed higher than a predetermined speed. The predetermined speed may be 30 rpm. In the post-planarization phase, polishing may be effected by means of applying pressure greater than a predetermined pressure for pressing the surface to be polished against the polishing surface. The predetermined pressure may be 30 Kpa. Highly-selective slurry is used as ceria slurry, or ordinary ceria slurry is used as the ceria slurry in some of the plurality of phases, and highly-selective ceria slurry is used in the remaining phases.

The foregoing embodiment has shown only an embodiment of the present invention. The technical scope of the present invention should not be construed limitedly by the embodiment. More specifically, the present invention can be carried out in various forms without departing from the scope of spirit or principal features of the present invention.

For example, a substance to be polished through use of ceria slurry is not limited solely to a Si wafer, but may be a quartz substrate or a ceramic substrate. The present invention can be applied to any type of device wafer having irregular patterns formed thereon (i.e., a patterned wafer).

A semiconductor device can be manufactured by means of applying the polishing method according to the present invention to abrasion of a semiconductor substrate.

The present invention is constructed in the manner as described above, and a round of polishing processes is divided into a plurality of phases. Polishing of a wafer is performed under polishing requirements which vary from phase to phase as appropriate. The polishing rate is increased for each phase, and a polishing time can be shortened. So long as a wafer is polished through use of highly-selective ceria slurry having superior smoothness in at least some of phases, high smoothness and high productivity can be achieved simultaneously.

The entire disclosure of a Japanese Patent Application No. 2001-163102, filed on May 30, 2001 including specification, claims drawings and summary, on which the Convention priority of the present application is based, are incorporated herein by reference in its entirety.

What is claimed is:

1. A polishing method using ceria slurry, in which ceria slurry is supplied to polishing surface in rotation, and a surface of a semiconductor substrate opposing the polishing surface is pressed against the polishing surface, thereby polishing the surface to be polished, wherein the polishing process comprises an early polishing phase, a planarization phase, and a post-planarization phase, the method comprising:

conducting the early polishing phase at a first pressure ($P_1$) greater than 30 KPa while rotating the polishing surface and surface to be polished at a first speed ($R_1$);

conducting the planarization phase at a second pressure ($P_2$) greater than $P_1$, while rotating the polishing surface and surface to be polished at a second speed ($R_2$) greater than 30 rpm and greater than $R_1$; and conducting the post planarization phase at a third pressure ($P_3$) greater than 30 KPa and greater than $P_2$.

2. The polishing method according to claim 1, wherein, the early polishing phase is effected at a pressure of 50 to 70 KPa.

3. The polishing method according to claim 1, wherein the planarization phase is effected while the polishing surface is rotated at a speed of 70 to 120 rpm.

4. The polishing method according to claim 1, wherein the post-planarization phase is effected at a pressure of 30 to 60 KPa.

5. The polishing method according to claim 1, wherein highly-selective slurry is used as ceria slurry.

6. The polishing method according to claim 1, wherein ordinary ceria slurry is used as the ceria slurry in some of the plurality of phases, and highly-selective ceria slurry is used in the remaining phases.

7. A method of manufacturing a semiconductor device, wherein the polishing method according to claim 1 is used.

* * * * *